US008169239B2

(12) United States Patent
Weng et al.

(10) Patent No.: US 8,169,239 B2
(45) **Date of Patent: *May 1, 2012**

(54) DRIVER CIRCUIT OF DISPLAY DEVICE

(75) Inventors: Meng-Tse Weng, Tainan County (TW); Chien-Ru Chen, Tainan County (TW)

(73) Assignee: Himax Technologies Limited, Tainan (TW)

( * ) Notice: Subject to any disclaimer, the term of this patent is extended or adjusted under 35 U.S.C. 154(b) by 516 days.

This patent is subject to a terminal disclaimer.

(21) Appl. No.: 12/423,185

(22) Filed: Apr. 14, 2009

(65) Prior Publication Data

US 2010/0259522 A1 Oct. 14, 2010

(51) Int. Cl.
*H03B 1/00* (2006.01)

(52) U.S. Cl. ........................................................ 327/109

(58) Field of Classification Search ................... 327/109
See application file for complete search history.

(56) References Cited

U.S. PATENT DOCUMENTS 7,221,197 B2 * 5/2007 Morita .......................... 327/112
7,355,459 B2 * 4/2008 Miyazawa .................... 327/112
7,804,338 B2 * 9/2010 Nagumo ....................... 327/108
7,973,572 B2 * 7/2011 Chang ........................... 327/108

* cited by examiner

*Primary Examiner* — Hai L Nguyen
(74) *Attorney, Agent, or Firm* — J.C. Patents

(57) ABSTRACT

A driver circuit includes a mode control unit and a plurality of source drivers to drive a display panel including N pixel cells on each scan line. Each source driver has M driving channels, and a first subset of the driving channels and a second subset of the driving channels are respectively in a first mode and a second mode according to a preset mode sequence, wherein M≧N. The $1^{st}$ through $N^{th}$ driving channels of a first source driver and the $M^{th}$ through $(M-N+1)^{th}$ driving channels of a second source driver respectively drive the $1^{st}$ through $N^{th}$ pixel cells during a first scan period and a second scan period. The modes of the $M^{th}$ through $1^{st}$ driving channels of the second source driver are respectively altered to match the modes of the $1^{st}$ through $M^{th}$ driving channels of the first source driver by the mode control unit.

11 Claims, 10 Drawing Sheets

300

500

600

800

DRIVER CIRCUIT OF DISPLAY DEVICE

BACKGROUND OF THE INVENTION

1. Field of the Invention

The present invention generally relates to a driver circuit, and more particularly to a driver circuit for reducing power consumption of the display device.

2. Description of Related Art

A liquid crystal display (LCD) includes a timing controller, a display panel, a plurality of gate drivers, and a plurality of source drivers. The display panel includes a plurality of pixel cells arranged in an array, and each pixel cell is coupled to one of a plurality of scan lines and one of a plurality of data lines. The timing controller outputs video data to the source drivers for converting the video data into data driving signals. In addition, the timing controller controls each gate driver to sequentially enable the scan lines, and then controls each source driver to deliver data driving signals to the pixel cells on the enabled scan line via the data liens so as to display a frame.

Generally, the polarities of the data driving signals delivering to the same pixel cell on two successive frames are complementary to prevent the liquid crystal from being polarized by residual charges of the pixel cell. As for the same frame, the data driving signal of a certain pixel cell may have a reversed polarity relative to its adjacent pixel cells to prevent low display quality caused by the crosstalk problem. There are several kinds of polarity inversion, such as frame inversion, column inversion, row inversion, and dot inversion. Taking the dot inversion for example, the adjacent pixel cells on the same data line and the adjacent pixel cells on the same scan line should be driven by the data driving signals with different polarities, e.g. positive polarity and negative polarity. The source driver have to alternatively deliver the data driving signal with the positive polarity and the data driving signal with negative polarity in different scan periods, respectively, for driving the pixel cells on the same data line. Such kind of the source driver causes more power consumption due to high voltage swings of the data driving signals.

On the contrary, the column inversion or the frame inversion is usually adopted for saving power consumption, since the source driver outputs the data driving signals with the same polarity to the pixel cells on the same data line in different scan periods. Nevertheless, the display quality of performing the column inversion or the frame inversion is not good as the dot inversion. As a result, designers have disturbance on trading off between the power consumption and the display quality.

Additionally, when performing polarity inversion, if frequency of switching the positive polarity and the negative polarity is not quick enough, people may perceived flickers on frames easily. Therefore, a Point-to-Point Reduced Swing Differential Signaling (PPRSDS) source driver is provided to increase the operation frequency thereof as desired. The PPRSDS source driver includes a plurality of driving channels controlled by the timing controller, wherein each of the driving channels can receive video data from one of two data paths. In the meantime, each driving channel of the PPRSDS source driver should be set a corresponding data mode for receiving the video data from the corresponding data path.

The number of the source driver used in the LCD increases with the increases of the resolution of the display panel. The source drivers may be disposed at different sides of the display panel, e.g. upper side and lower side, due to the limitation of panel layout space. As a result, the driving channels of different source drivers at two ends of the same data line may have different data modes, or namely have unmatched data modes, to correctly receive video data. Therefore, there should be a correlative scheme to ensure that the driving channels of the source driver can receive the corresponding video data.

SUMMARY OF THE INVENTION

Accordingly, the present invention provides a driver circuit and a display device using the same that saves power consumption by reducing voltage swing of each driving channel thereof and increases display quality by performing dot inversion. In addition, the driver circuit alters data modes of the driving channels at two ends of same data line to be matched for ensuring each driving channel receives signal from correct data path.

The present invention provides a driver circuit. The driver circuit, adapted to a display panel including N pixel cells on each of a plurality of scan lines, includes a mode control unit and a plurality of source drivers. Each source driver has M driving channels, wherein $M \geqq N$ and in accordance with a preset mode sequence, a first subset and a second subset of the driving channels of each source driver are respectively are in a first mode and in a second mode. The source drivers include at least a first source driver and a second source driver. The $1^{st}$ through $N^{th}$ driving channels of the first source driver are respectively used for driving the $1^{st}$ through $N^{th}$ pixel cells during a first scan period. The used driving channels in the first subset of the driving channels of the first source driver sequentially activated by a first start pulse to receive a first pixel signal from a first data bus, and the used driving channels in the second subset of the driving channels of the first source driver sequentially activated by a second start pulse to receive the second pixel signal from the second data bus. The $M^{th}$ through $(M-N+1)^{th}$ driving channels of the second source driver are respectively used for driving the $1^{st}$ through $N^{th}$ pixel cells during a second scan period. The mode control unit controls the used driving channels in a third subset of the driving channels of the second source driver sequentially activated by the first start pulse to receive the first pixel signal from the first data bus, and the used driving channels in a fourth subset of the driving channels of the second source driver sequentially activated by the second start pulse to receive the second pixel signal from the second data bus, so as to make the driving channels of the first source driver and the second source driver at two ends of each of a plurality of data lines to receive the pixel signals from the same data bus.

In an embodiment of the foregoing driver circuit, the first subset of the driving channels of each source driver includes the $(4i+1)^{th}$ driving channel and the $(4i+2)^{th}$ driving channel of each source driver, and the second subset of the driving channels of each source driver includes the $(4i+3)^{th}$ driving channel and the $(4i+4)^{th}$ driving channel of each source driver according to the preset mode sequence, and i is non-negative integer.

In an embodiment of the foregoing driver circuit, the first subset of the driving channels of each source driver includes the $(2i+1)^{th}$ driving channel of each source driver, and the second subset of the driving channels of each source driver includes the $(2i+2)^{th}$ driving channel of each source driver according to the preset mode sequence, and i is non-negative integer.

In an embodiment of the foregoing driver circuit, the $2^{nd}$ through $(N+1)^{th}$ driving channels of the first source driver are respectively used for driving the $1^{st}$ through $N^{th}$ pixel cells during a third scan period, and the $(M-1)^{th}$ through $(M-N)^{th}$ driving channels of the second source driver are respectively used for driving the $1^{st}$ through $N^{th}$ pixel cells during a fourth scan period.

The present invention provides the driver circuit that during different scan periods, each of a plurality of driving channels in the driver circuit respectively can output data driving signals with the same polarity to pixel cells arranged in a zigzag manner interlaced on two neighboring data lines for performing dot inversion. Therefore, each driving channel of the source driver reduces its voltage swing for saving the power consumption, and increasing display quality by performing dot inversion. Additionally, data modes of driving channels at two ends of the same data line in different source drivers are altered to be matched in order to ensure that the driving channels of each source driver can receive video data from the correct data path.

In order to make the features and advantages of the present invention comprehensible, preferred embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
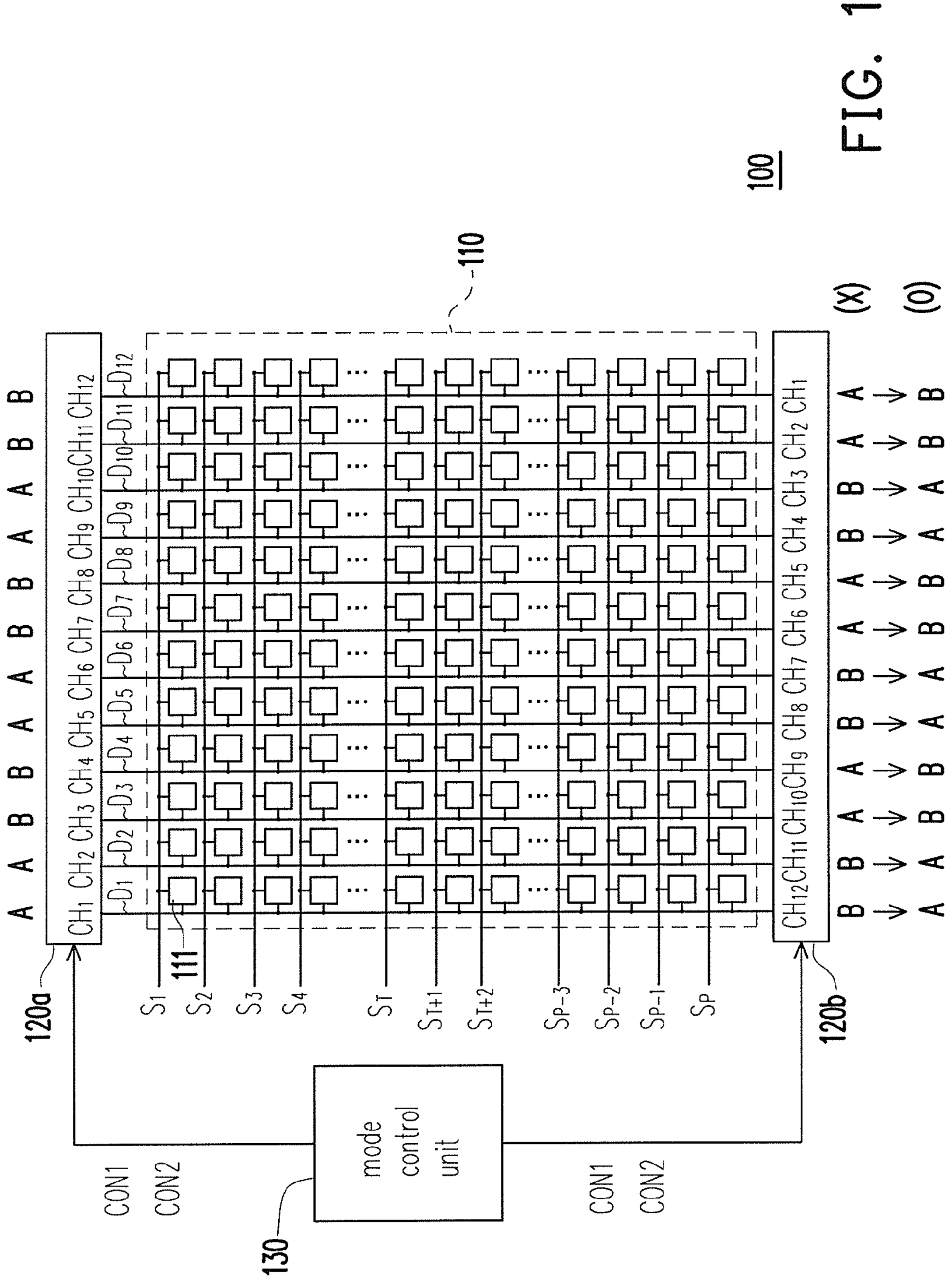
FIG. 1 is a diagram of a display device according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a diagram of a display device according to an embodiment of the present invention. Referring to FIG. 1, the display device 100, such as liquid crystal display (LCD), includes a display panel 110 and a driver circuit for driving a plurality of pixel cells 111 arranged in an array manner on the display panel 110. There are N pixel cells on each of a plurality of scan lines $S_1$-$S_P$, wherein N and P are positive integers, for example, N=12, and the N pixel cells 111 on each scan line respectively coupled to the data lines $D_1$-$D_N$. The driver circuit includes a mode control unit 130 and a plurality of source drivers, e.g., the source drivers 120*a* and 120*b*. Each of the source drivers 120*a* and 120*b* includes M driving channels, wherein M is positive integer and M≧N.

Due to the limitation of panel layout space, the source driver 120*a* and the source driver 120*b* may be disposed on different sides of the display panel 110, such as upper side and lower side. Therefore, when the scan lines $S_1$-$S_P$ are sequentially asserted, the source driver 120*a* is responsible for driving the pixel cells 111 on each scan line in the upper display panel 110, and the source driver 120*b* is responsible for driving the pixel cells 111 on each scan line in the lower display panel 110. For the upper display panel 110, the driving channels $CH_1$-$CH_{12}$ of the source driver 120*a* are respectively used for driving the pixel cells 111 on a first scan line (e.g. $S_1$) via the data lines $D_1$-$D_{12}$ during a first scan period. It is assumed that the scan line $S_P$ in the lower display panel 110 follows the scan line $S_T$ in the upper display panel 110 to be asserted herein, but the present invention is not limited to the order of asserting the sane lines, for example, instead of the scan line $S_P$, the scan line $S_{T+1}$ in the lower display panel 110 can follow the scan line $S_T$ in the upper display panel 110 to be asserted. The driving channels $CH_{12}$-$CH_1$ of the source driver 120*b* are respectively used for driving the pixel cells 111 on a second scan line (e.g. $S_P$) via the data lines $D_1$-$D_{12}$ during a second scan period.

The source drivers 120*a* and 120*b*, for example, are Point-to-Point Reduced Swing Differential Signaling (PPRSDS) source drivers. The PPRSDS source driver can receive signals, i.e. video data, simultaneously from two data paths so as to increase operation frequency thereof. Each driving channel of each source driver 120*a*/120*b* is either set in a first mode or a second mode for receiving a first pixel signal from a first data bus or a second pixel signal from a second data bus, wherein the first mode and the second mode are respectively symbolized as A and B. There are three types of transmission mode in the source driver, i.e. types of AAAA, AABB, and ABAB. In AAAA type, the driving channels of each source driver 120*a*/120*b* sequentially receive the first pixel signal from the same data bus, i.e. the first data bus. In AABB type, every two of the driving channels of each source driver 120*a*/120*b* alternatively receive the first pixel signal from the first data bus and the second pixel signal from the second data bus. In ABAB type, each of the driving channels of each source driver 120*a*/120*b* alternatively receives the first pixel signal from the first data bus and the second pixel signal from the second data bus.

Referring to FIG. 1, it is assumed that there are 4k+4 driving channels, wherein k is non-negative integer, e.g. k=2. As to AABB type, a first subset of the driving channels of each source driver 120*a*/120*b*, i.e. the $(4i+1)^{th}$ driving channel $CH_{4k+1}$ and the $(4i+2)^{th}$ driving channel $CH_{4k+2}$, are in the A mode for receiving the first pixel signal from the first data bus, and a second subset of the driving channels of each source driver 120*a*/120*b*, i.e. the $(4i+3)^{th}$ driving channel $CH_{4k+3}$ and the $(4i+4)^{th}$ driving channel $CH_{4k+4}$, are in the B mode for receiving the second pixel signal from the second data bus, wherein i is non-negative integer. Since the source drivers 120*a* and 120*b* are disposed on different sides of the display panel 110, as to the data lines $D_1$ through $D_{12}$, the modes of the $12^{th}$ through $1^{st}$ driving channels $CH_{12}$-$CH_1$ of the source driver 120*b* are respectively different to the modes of the $1^{st}$ through $12^{th}$ driving channels $CH_1$-$CH_{12}$ of the source driver 120*a*. Namely, the driving channels of different source drivers 120*a* and 120*b* at two ends of each data line $D_1$-$D_{12}$, e.g. the driving channel $CH_1$ of the source driver 120*a* and the driving channel $CH_{12}$ of the source driver 120*b*, are in different data modes, and the driving channels $CH_1$-$CH_{12}$ of the source driver 120*b* would provide the incorrect pixel signals to the pixel cells 110 on each scan line. Therefore, a third subset of the driving channels of the source driver 120*b*, i.e. the $(4i+3)^{th}$ driving channel and the $(4i+4)^{th}$ driving channel, should be appropriately controlled to receive the first pixel data from the first data bus, and a fourth subset of the driving channels of the source driver 120*b*, i.e. the $(4i+1)^{th}$ driving channel and the $(4i+2)^{th}$ driving channel, should be appropriately controlled to receive the second pixel data from the second data bus.

Figure 2A:
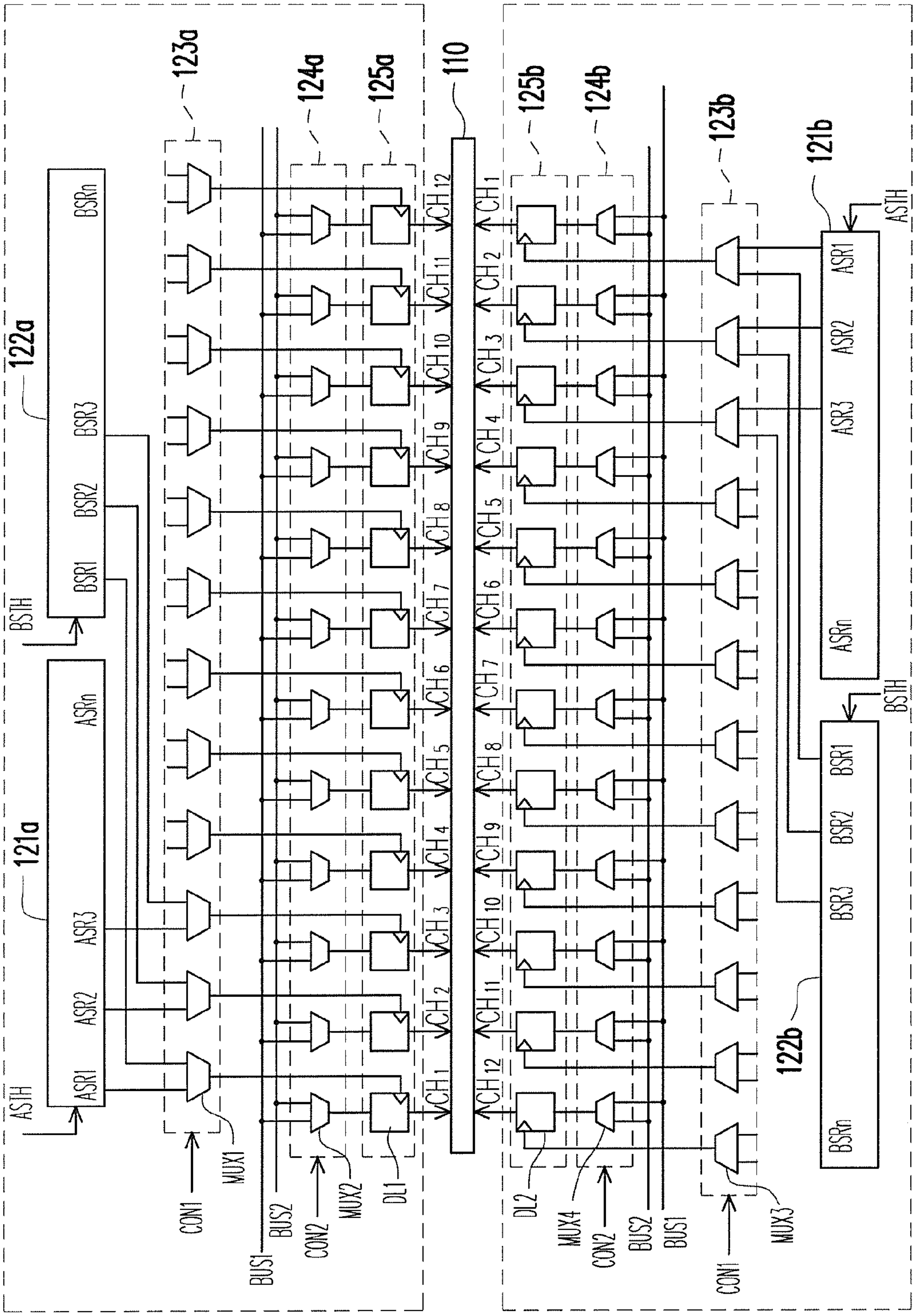
FIG. 2A is a circuit diagram of the source drivers 120*a* and 120*b* according to the embodiment in FIG. 1.
Figure 2B:
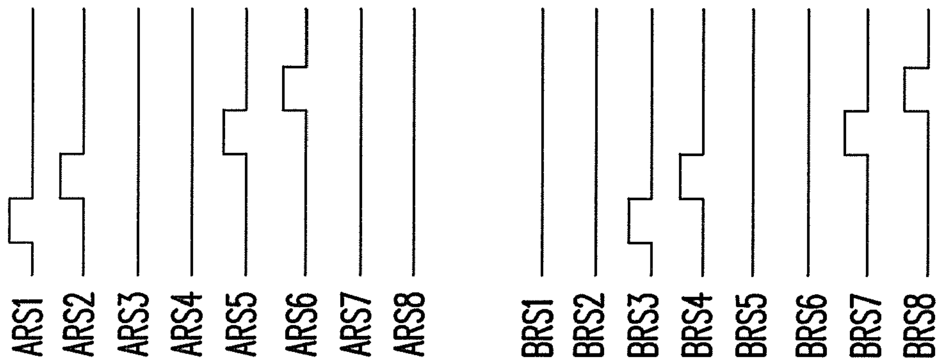
FIG. 2B is a timing diagram of the shift register modules 121*a* and 122*a* according to the embodiment in FIG. 2A.

FIG. 2A is a circuit diagram of the source drivers 120*a* and 120*b* according to the embodiment in FIG. 1. Referring to FIG. 2A, the source driver 120*a* includes shift register modules 121*a* and 122*a*, a shift multiplexer module 123*a*, a data multiplexer module 124*a*, and a data latch module 125*a*. The shift register module 121*a* includes a plurality of shift registers ASR1-ASRn, and the shift register module 122*a* includes a plurality of shift registers BSR1-BSRn. FIG. 2B is a timing diagram of the shift register modules 121*a* according to the embodiment in FIG. 2A. Referring to FIG. 2A and FIG. 2B, the shift registers ASR1, ASR2, ASR5, ASR6, ASR9, and ASR10 corresponding to the used driving channels $CH_1$, $CH_2$, $CH_5$, $CH_6$, $CH_9$, and $CH_{10}$ in the first subset of the driving channels of the source driver 120*a* sequentially shift the first start pulse ASTH, and the shift registers BSR3, BSR4, BSR7, BSR8, BSR11, and BSR12 corresponding to the used driving channels $CH_3$, $CH_4$, $CH_7$, $CH_8$, $CH_{11}$, and $CH_{12}$ in the second subset of the driving channels of the source driver 120*a* sequentially shift the second start pulse BSTH.

The shift multiplexer module 123*a* includes a plurality of shift multiplexers MUX1. Each of the shift multiplexers MUX1 corresponding to the N used driving channels (e.g. $CH_1$-$CH_{12}$, etc.) of the source driver 120*a* selects one of the first start pulse ASTH shifted by the corresponding shift register ASR and the second start pulse BSTH shifted by the corresponding shift register BSR according to a shift control signal CON1 generated by the mode control unit 130. The data multiplexer module 124*a* includes a plurality of data multiplexers MUX2. Each of the data multiplexers MUX2 corresponding to the N used driving channels (e.g. $CH_1$-$CH_{12}$, etc.) of the source driver 120*a* selects one of the first pixel signal from the first data bus BUS1 and the second pixel signal from the second data bus BUS2 according to a data control signal CON2 generated by the mode control unit 130. The data latch module 125*a* includes a plurality of data latches DL1. Each of the data latches DL1 is controlled by the selected start pulse from the corresponding shift multiplexer MUX1 to latch the selected pixel signal from the corresponding data multiplexer MUX2.

Similarly, the source driver 120*b* includes shift register modules 121*b* and 122*b*, a shift multiplexer module 123*b*, a data multiplexer module 124*b*, and a data latch module 125*b*. The shift registers ASR12, ASR11, ASR8, ASR7, ASR4, and ASR3 in the shift register 121*b* corresponding to the used driving channels $CH_{12}$, $CH_{11}$, $CH_8$, $CH_7$, $CH_4$, and $CH_3$ in the third subset of the driving channels of the source driver 120*b* sequentially shift the first start pulse ASTH. The shift registers BSR10, BSR9, BSR6, BSR5, BSR2, and BSR1, in the shift register 122*b* corresponding to the used driving channels $CH_{10}$, $CH_9$, $CH_6$, $CH_5$, $CH_2$, and $CH_1$ in the fourth subset of the driving channels of the source driver 120*b* sequentially shift the second start pulse BSTH. Hence, each of the data latches DL2 in the data latch module 125*b* is controlled by the selected start pulse from the corresponding shift multiplexer MUX3 in the shift multiplexer module 123*b* to latch the selected pixel signal from the corresponding data multiplexer MUX4 in the shift multiplexer module 124*b*.

It is noted that the source drivers 120*a* and 120*b* may further include a digital-to-analog converter module for converting the pixel signal into an analog voltage, an output buffer module for enhancing the analog voltage, and etc. People ordinarily skilled in the art realize the operation of the said components in the source driver, so that details related to the connection between the said components in the source driver are not described herein.

In the embodiment of the present invention, the mode control unit 130 controls the used driving channels $CH_1$, $CH_2$, $CH_5$, $CH_6$, $CH_9$, and $CH_{10}$ in the first subset of the driving channels of the source driver 120*a* sequentially activated by the first start pulse ASTH to receive the first pixel signal from the first data bus BUS1, and controls the used driving channels $CH_3$, $CH_4$, $CH_7$, $CH_8$, $CH_{11}$, and $CH_{12}$ in the second subset of the driving channels of the source driver 120*a* sequentially activated by the second start pulse BSTH to receive the second pixel signal from the second data bus BUS2 according to the shift control signal CON1 and the data control signal CON2. In addition, the mode control unit 130 controls the used driving channels $CH_{12}$, $CH_{11}$, $CH_8$, $CH_7$, $CH_4$, and $CH_3$ in the third subset of the driving channels of the source driver 120*b* sequentially activated by the first start pulse ASTH to receive the first pixel signal from the first data bus BUS1, and controls the used driving channels $CH_{10}$, $CH_9$, $CH_6$, $CH_5$, $CH_2$, and $CH_1$ in the fourth subset of the driving channels of the source driver 120*b* sequentially activated by the second start pulse to receive the second pixel signal from the second data bus BUS2 according to the shift control signal CON1 and the data control signal CON2. Therefore, the driving channels of different source drivers 120*a* and 120*b* at two ends of each data line $D_1$-$D_{12}$ can receive the pixel signals from the same data bus.

Figure 3:
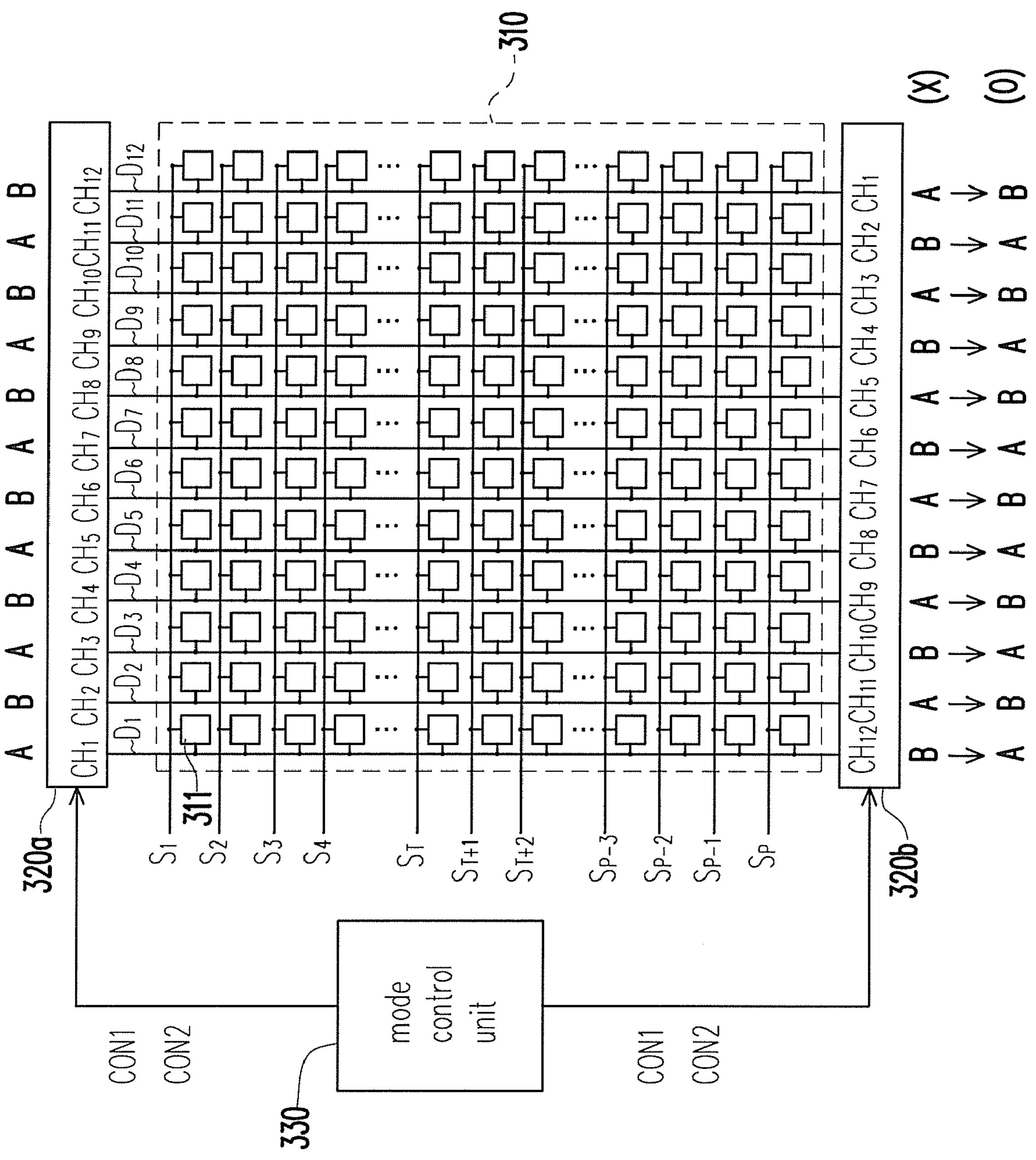
FIG. 3 through FIG. 9 are diagrams of a display device according to an embodiment of the present invention.

FIG. 3 is a diagram of a display device according to an embodiment of the present invention. Referring to FIG. 3, it is assumed that there are 4k+4 driving channels, wherein k is non-negative integer, e.g. k=2. As to ABAB type, a first subset of the driving channels of each source driver 320*a*/320*b*, i.e. the $(2i+1)^{th}$ driving channel $CH_{2i+1}$, are in the A mode for receiving the first pixel signal from the first data bus, and a second subset of the driving channels of each source driver 320*a*/320*b*, i.e. the $(2i+2)^{th}$ driving channel $CH_{2i+2}$, are in the B mode for receiving the second pixel signal from the second data bus, wherein i is non-negative integer. Since the source drivers 320*a* and 320*b* are disposed on different sides of the display panel 310, the modes of the $12^{th}$ through $1^{st}$ driving channels $CH_{12}$-$CH_1$ of the source driver 320*b* are respectively different to the modes of the $1^{st}$ through $12^{th}$ driving channels $CH_1$-$CH_{12}$ of the source driver 320*a*. Hence, a third subset of the driving channels of the source driver 320*b*, i.e. the $(2i+2)^{th}$ driving channel $CH_{2i+2}$, should be appropriately controlled to receive the first pixel data from the first data bus BUS1, and a fourth subset of the driving channels of the source driver 320*b*, i.e. the $(2i+1)^{th}$ driving channel $CH_{2i+1}$, should be appropriately controlled to receive the second pixel data from the second data bus BUS2.

By referring the circuit shown in FIG. 2A, the mode control unit 330 controls the used driving channels $CH_1$, $CH_3$, $CH_5$, $CH_7$, $CH_9$, and $CH_{11}$ in the first subset of the driving channels of the source driver 320*a* sequentially activated by the first start pulse ASTH to receive the first pixel signal from the first data bus BUS1, and controls the used driving channels $CH_2$, $CH_4$, $CH_6$, $CH_8$, $CH_{10}$, and $CH_{12}$ in the second subset of the driving channels of the source driver 320*a* sequentially activated by the second start pulse BSTH to receive the second pixel signal from the second data bus BUS2 according to the shift control signal CON1 and the data control signal CON2. In addition, the mode control unit 330 controls the used driving channels $CH_{12}$, $CH_{10}$, $CH_8$, $CH_6$, $CH_4$, and $CH_2$ in the third subset of the driving channels of the source driver 320*b* sequentially activated by the first start pulse ASTH to receive the first pixel signal from the first data bus BUS1, and controls the used driving channels $CH_{11}$, $CH_9$, $CH_7$, $CH_5$, $CH_3$, and $CH_1$ in the fourth subset of the driving channels of the source driver 320*b* sequentially activated by the second start pulse to receive the second pixel signal from the second data bus BUS2 according to the shift control signal CON1 and the data control signal CON2.

Figure 4:
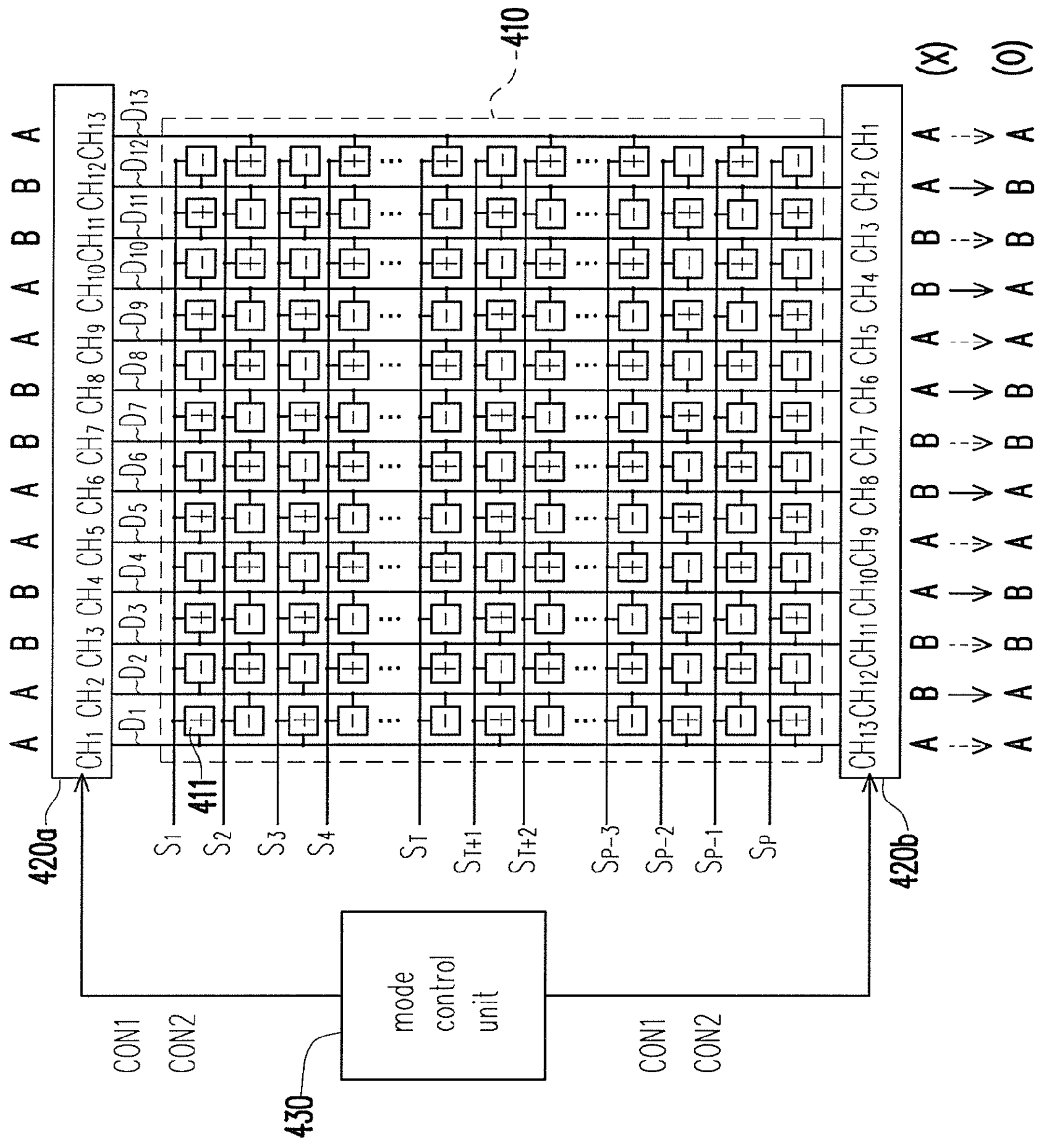

FIG. 4 is a diagram of a display device according to an embodiment of the present invention. Referring to FIG. 4, the display device 400 includes a display panel 410 and a driver circuit for driving a plurality of pixel cells 411 arranged in an array manner on the display panel 410. There are N pixel cells on each of a plurality of scan lines $S_1$-$S_P$, wherein N and P are positive integers, for example, N=12. The display panel 410, including the N pixel cells 411 on the odd-numbered scan line (e.g. $S_1$) respectively coupled to data lines $D_1$-$D_N$ and the N pixel cells 411 on the even-numbered scan line (e.g. $S_2$) respectively coupled to data lines $D_2$-$D_{N+1}$, is adopted in the embodiment of the present invention. Although such kind of the display panel 411 is taken as example for description, the present invention is not limited thereto. People ordinarily skilled in the art can also utilize traditional display panel including the N pixel cells on each scan line respectively coupled to the data lines $D_1$-$D_N$ to practice the present invention.

The driver circuit includes a mode control unit 430 and a plurality of source drivers, e.g., the source drivers 420*a* and 420*b*. Each source driver includes M driving channels, wherein M is positive integer and (M−N)≧1. For the upper display panel 410, the driving channels $CH_1$-$CH_{12}$ of the source driver 420*a* are respectively used for driving to the pixel cells 411 on a first scan line (e.g. $S_1$) via the data lines $D_1$-$D_{12}$ during a first scan period. Then, the driving channels $CH_2$-$CH_{13}$ of the source driver 420*a* are respectively used for driving to the pixel cells 411 on a second scan line (e.g. $S_2$) via the data lines $D_2$-$D_{13}$ during a second scan period. The scan period is a period of asserting the corresponding scan line. To reason by analogy, the pixel cells 411 on the lines $S_3$ are driven by the driving channels $CH_1$-$CH_{12}$ of the source driver 420*a* when the scan line $S_3$ follows the scan line $S_2$ to be asserted, and the pixel cells 411 on the scan line $S_4$ are driven by the driving channels $CH_2$-$CH_{13}$ of the source driver 420*a* when the scan line $S_4$ follows the scan line $S_3$ to be asserted.

The driving channels $CH_{13}$-$CH_2$ of the source driver 420*b* are respectively used for driving the pixel cells 411 on a third scan line (e.g. $S_p$) via the data lines $D_1$-$D_{12}$ during a third scan period. Then, the driving channels $CH_{12}$-$CH_1$ of the source driver 420*b* are respectively used for driving the pixel cells 411 on a fourth scan line (e.g. $S_{p-1}$) via the data lines $D_2$-$D_{13}$ during a fourth scan period. To reason by analogy, the pixel cells 411 on the scan lines $S_{P-2}$ are driven by the driving channels $CH_{13}$-$CH_2$ of the source driver 420*b* when the scan line $S_{P-2}$ follows the scan line $S_{P-1}$ to be asserted, and the pixel cells 411 on the scan line $S_{P-3}$ are driven by the driving channels $CH_{12}$-$CH_1$ of the source driver 420*b*.

The driving channel of each source driver 420*a*/420*b* transmits the data driving signals to the pixel cells 411 arranged in a zigzag manner interlaced on two neighboring data lines. For the convenience of description, the pixel cell 411 in the intersection of the scan line and the data line is symbolized as (S, D). For example, the driving channel $CH_2$ of the source driver 420*a* sequentially drive the pixel cells 411 ($S_1$, $D_2$), ($S_2$, $D_1$), ($S_3$, $D_2$), and so on. In the embodiment of the present invention, each driving channel of each source driver 420*a*/420*b* outputs the data driving signals with the same polarity (e.g. positive polarity denoted as "+"), and the adjacent driving channel of each source driver 420*a*/420*b* outputs the data driving signals with the complementary polarity (e.g. negative polarity denoted as "−") for performing dot inversion. Hence, the power consumption can be reduced since the voltage swing of each driving channel is reduced.

Referring to FIG. 4, it is assumed that there are 4k+1 driving channels, wherein k≧0, e.g. k=3. As to AABB type, a first subset of the driving channels of each source driver 420*a*/420*b*, i.e. the $(4i+1)^{th}$ driving channel and the $(4i+2)^{th}$ driving channel, are in the A mode, and a second subset of the driving channels of each source driver 420*a*/420*b*, i.e. the $(4i+3)^{th}$ driving channel and the $(4i+4)^{th}$ driving channel, are in the B mode, wherein i≧0. Hence, the modes of the driving channels $CH_1$-$CH_{12}$ of the source driver 420*a* are AABB . . . ABBA, but the modes of the driving channels $CH_{12}$-$CH_1$ of the source driver 420*b* are ABBA . . . BBAA. In the embodiment of the present invention, a third subset of the driving channels of the source driver 420*b*, i.e. the $(4i+1)^{th}$ driving channel and the $(4i+4)^{th}$ driving channel, should be appropriately controlled to receive the first pixel data from the first data bus BUS1, and a fourth subset of the driving channels of the source driver 420*b*, i.e. the $(4i+2)^{th}$ driving channel and the $(4i+3)^{th}$ driving channel, should be appropriately controlled to receive the second pixel data from the second data bus BUS2.

By referring the circuit shown in FIG. 2A, the mode control unit 430 controls the used driving channels $CH_1$, $CH_2$, $CH_5$, $CH_6$, $CH_9$, and $CH_{10}$ in the first subset of the driving channels of the source driver 420*a* sequentially activated by the first start pulse ASTH to receive the first pixel signal from the first data bus BUS1, and controls the used driving channels $CH_3$, $CH_4$, $CH_7$, $CH_8$, $CH_{11}$, and $CH_{12}$ in the second subset of the driving channels of the source driver 420*a* sequentially activated by the second start pulse BSTH to receive the second pixel signal from the second data bus BUS2 according to the shift control signal CON1 and the data control signal CON2. In addition, the mode control unit 430 controls the used driving channels $CH_{13}$, $CH_{12}$, $CH_9$, $CH_8$, $CH_5$, and $CH_4$ in the third subset of the driving channels of the source driver 420*b* sequentially activated by the first start pulse ASTH to receive the first pixel signal from the first data bus BUS1, and controls the used driving channels $CH_{11}$, $CH_{10}$, $CH_7$, $CH_6$, $CH_3$, and $CH_2$ in the fourth subset of the driving channels of the source driver 420*b* sequentially activated by the second start pulse to receive the second pixel signal from the second data bus BUS2 according to the shift control signal CON1 and the data control signal CON2.

Figure 5:
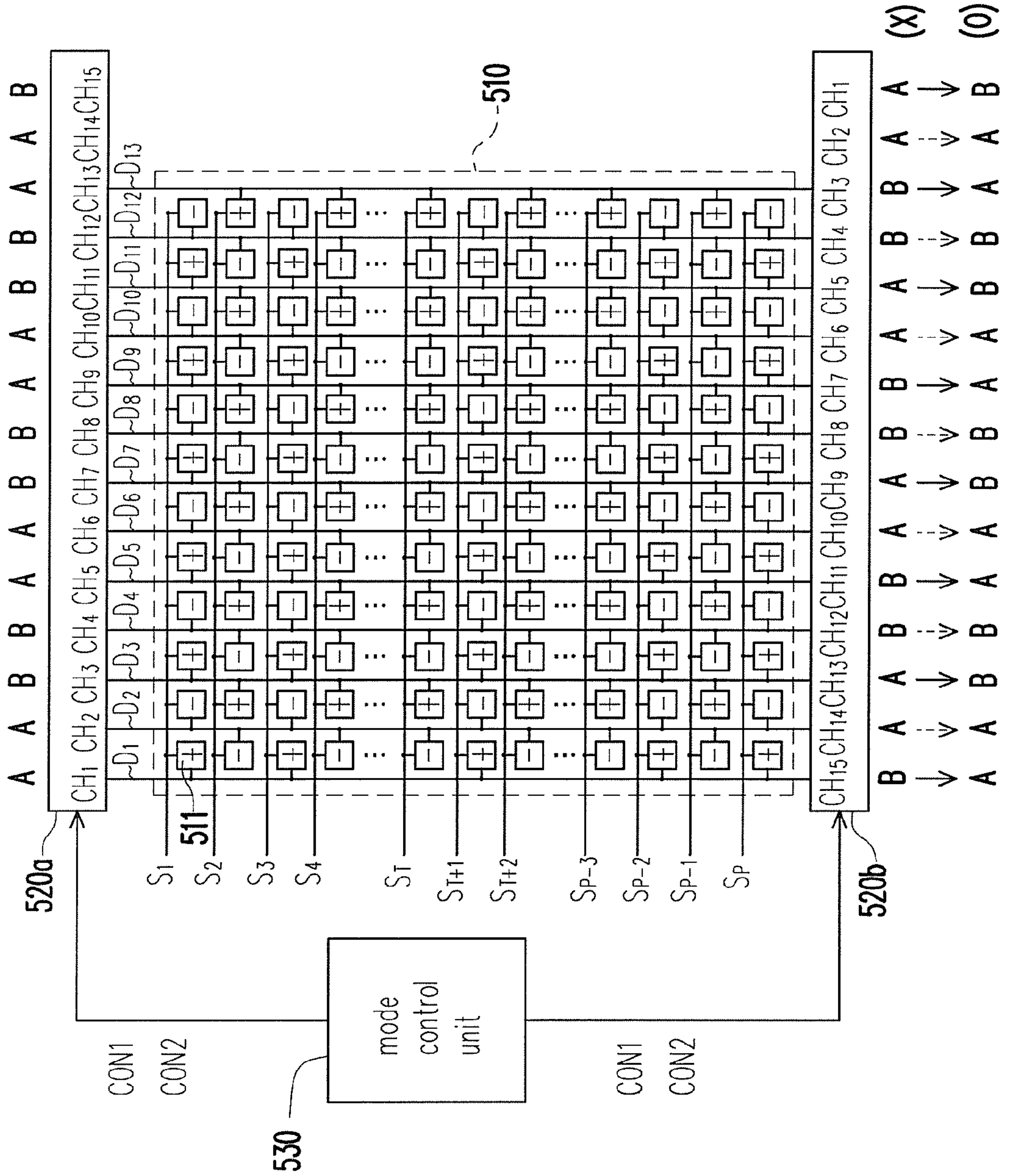

FIG. 5 is a diagram of a display device according to another embodiment of the present invention. Referring to FIG. 5, it is assumed that the number of the driving channels of each source driver 520*a*/520*b* is equal to (4k+3), for example, k=3. If AABB type is performed on each source driver 520*a*/520*b*, the modes of the driving channels $CH_1$-$CH_{15}$ of the source driver 520*a* are AABB . . . BAAB, but the modes of the driving channels $CH_{15}$-$CH_1$ of the source driver 520*b* are BAAB . . . BBAA. In the embodiment of the present invention, a third subset of the driving channels of the source driver 520*b*, i.e. the $(4i+2)^{th}$ driving channel $CH_{4i+2}$ and the $(4i+3)^{th}$ driving channel $CH_{4i+3}$, should be appropriately controlled to receive the first pixel data from the first data bus BUS1, and a fourth subset of the driving channels of the source driver 520*b*, i.e. the $(4i+1)^{th}$ driving channel $CH_{4i+1}$ and the $(4i+4)^{th}$ driving channel $CH_{4i+4}$, should be appropriately controlled to receive the second pixel data from the second data bus BUS2.

By referring the circuit shown in FIG. 2A, the mode control unit 530 controls the used driving channels $CH_1$, $CH_2$, $CH_5$, $CH_6$, $CH_9$, and $CH_{10}$ in the first subset of the driving channels of the source driver 520*a* sequentially activated by the first start pulse ASTH to receive the first pixel signal from the first data bus BUS1, and controls the used driving channels $CH_3$, $CH_4$, $CH_7$, $CH_8$, $CH_{11}$, and $CH_{12}$ in the second subset of the driving channels of the source driver 420*a* sequentially activated by the second start pulse BSTH to receive the second pixel signal from the second data bus BUS2 according to the shift control signal CON1 and the data control signal CON2. In addition, the mode control unit 530 controls the used driving channels $CH_{15}$, $CH_{14}$, $CH_{11}$, $CH_{10}$, $CH_7$, and $CH_6$ in the third subset of the driving channels of the source driver 520*b* sequentially activated by the first start pulse ASTH to receive the first pixel signal from the first data bus BUS1, and controls the used driving channels $CH_{13}$, $CH_{12}$, $CH_9$, $CH_8$, $CH_5$, and $CH_4$ in the fourth subset of the driving channels of the source driver 520*b* sequentially activated by the second start pulse to receive the second pixel signal from the second data bus BUS2 according to the shift control signal CON1 and the data control signal CON2.

Figure 6:
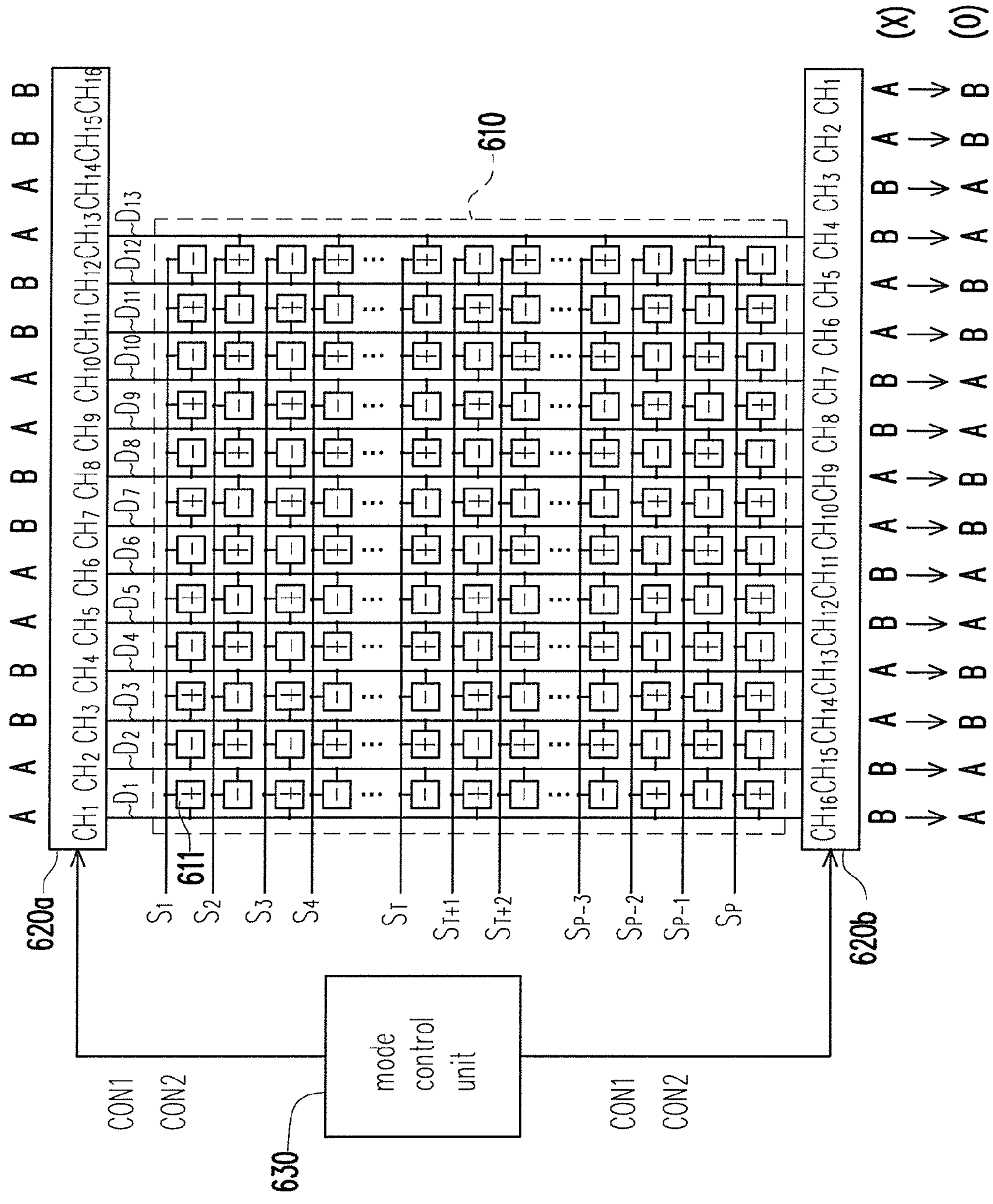

FIG. 6 is a diagram of a display device according to another embodiment of the present invention. Referring to FIG. 6, it is assumed that the number of the driving channels of each source driver 620*a*/620*b* is equal to 4k+4, for example, k=3. If AABB type is performed on each source driver 620*a*/620*b*, the modes of the driving channels $CH_1$-$CH_{16}$ of the source driver 620*a* are AABB . . . AABB, but the modes of the driving channels $CH_{16}$-$CH_1$ of the source driver 620*b* are BBAA . . . AABB. In the embodiment of the present invention, a third subset of the driving channels of the source driver 620*b*, i.e. the $(4i+3)^{th}$ driving channel $CH_{4k+3}$ and the $(4i+4)^{th}$ driving channel $CH_{4k+4}$, should be appropriately controlled to receive the first pixel data from the first data bus BUS1, and a fourth subset of the driving channels of the source driver 620*b*, i.e. the $(4i+1)^{th}$ driving channel $CH_{4+1}$ and the $(4i+2)^{th}$ driving channel $CH_{4k+2}$, should be appropriately controlled to receive the second pixel data from the second data bus BUS2.

By referring the circuit shown in FIG. 2A, the mode control unit 630 controls the used driving channels $CH_1$, $CH_2$, $CH_5$, $CH_6$, $CH_9$, and $CH_{10}$ in the first subset of the driving channels of the source driver 620*a* sequentially activated by the first start pulse ASTH to receive the first pixel signal from the first data bus BUS1, and controls the used driving channels $CH_3$, $CH_4$, $CH_7$, $CH_8$, $CH_{11}$, and $CH_{12}$ in the second subset of the driving channels of the source driver 620*a* sequentially activated by the second start pulse BSTH to receive the second pixel signal from the second data bus BUS2 according to the shift control signal CON1 and the data control signal CON2. In addition, the mode control unit 630 controls the used driving channels $CH_{16}$, $CH_{15}$, $CH_{12}$, $CH_{11}$, $CH_8$, and $CH_7$ in the third subset of the driving channels of the source driver 620*b* sequentially activated by the first start pulse ASTH to receive the first pixel signal from the first data bus BUS1, and controls the used driving channels $CH_{14}$, $CH_{13}$, $CH_{10}$, $CH_9$, $CH_6$, and $CH_5$ in the fourth subset of the driving channels of the source driver 620*b* sequentially activated by the second start pulse to receive the second pixel signal from the second data bus BUS2 according to the shift control signal CON1 and the data control signal CON2.

Figure 7:
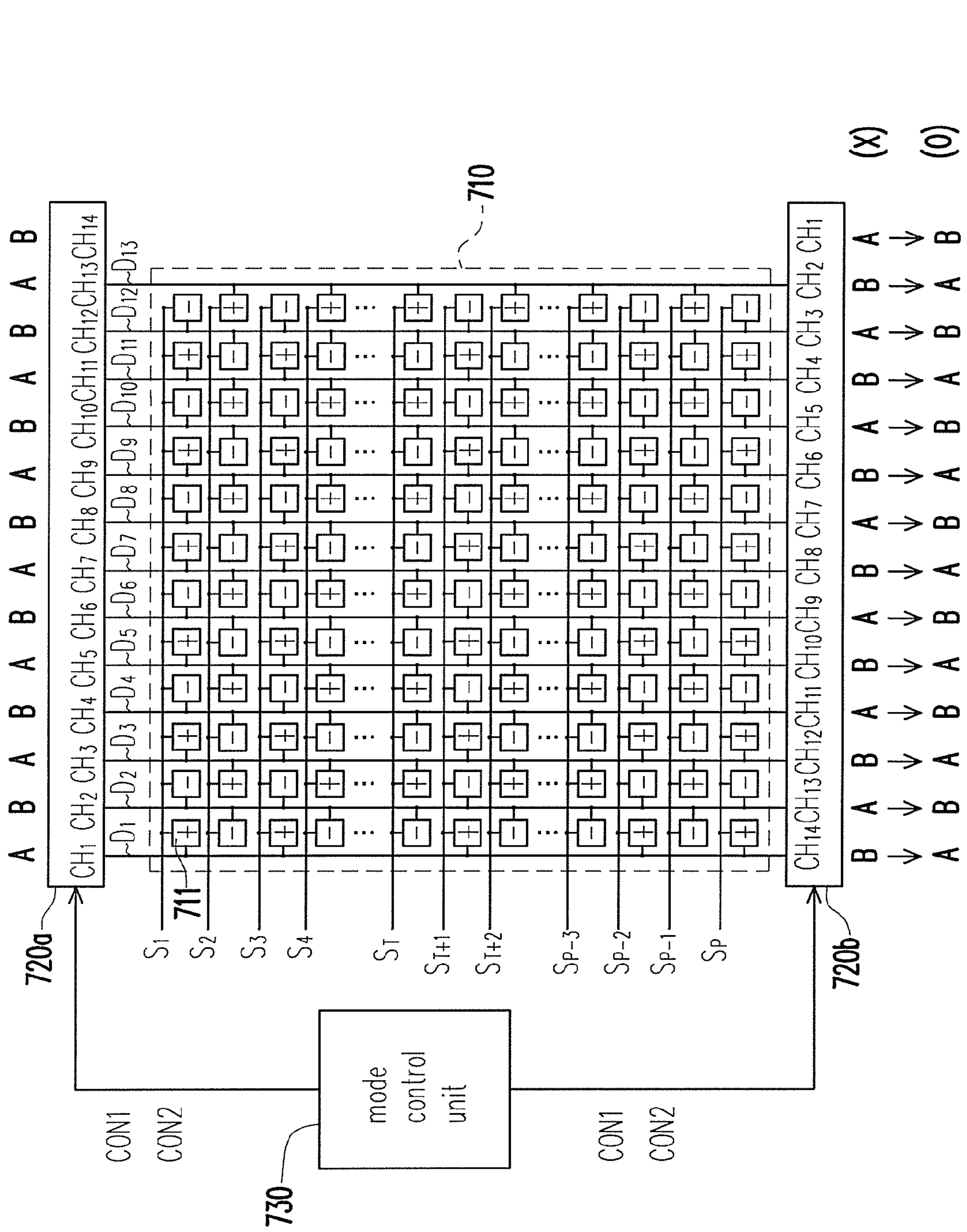

FIG. 7 is a diagram of a display device according to another embodiment of the present invention. Referring to FIG. 7, it is assumed that the number of the channel sets of each source driver 720*a*/720*b* is equal to 2k+2, for example, k=6. If ABAB type is performed on each source driver 720*a*/720*b*, a first subset of the driving channels of each source driver 720*a*/720*b*, i.e. the $(2i+1)^{th}$ driving channel $CH_{2i+1}$, are in the A mode, and a second subset of the driving channels of each source driver 720*a*/720*b*, i.e. the $(2i+2)^{th}$ driving channel $CH_{2i+2}$, are in the B mode. Hence, the modes of the driving channel $CH_1$-$CH_{14}$ of the source driver 720*a* are ABAB . . . AB, but the modes of the driving channel $CH_{14}$-$CH_1$ of the source driver 720*b* are BABA . . . BA. In the embodiment of the present invention, a third subset of the driving channels of the source driver 720*b*, i.e. the $(2i+2)^{th}$ driving channel $CH_{2i+2}$, should be appropriately controlled to receive the first pixel data from the first data bus, and a fourth subset of the driving channels of the source driver 720*b*, i.e. the $(2i+1)^{th}$ driving channel $CH_{2i+1}$, should be appropriately controlled to receive the second pixel data from the second data bus.

By referring the circuit shown in FIG. 2A, the mode control unit 730 controls the used driving channels $CH_1$, $CH_3$, $CH_5$, $CH_7$, $CH_9$, and $CH_{11}$ in the first subset of the driving channels of the source driver 720*a* sequentially activated by the first start pulse ASTH to receive the first pixel signal from the first data bus BUS1, and controls the used driving channels $CH_2$, $CH_4$, $CH_6$, $CH_8$, $CH_{10}$, and $CH_{12}$ in the second subset of the driving channels of the source driver 720*a* sequentially activated by the second start pulse BSTH to receive the second pixel signal from the second data bus BUS2 according to the shift control signal CON1 and the data control signal CON2. In addition, the mode control unit 730 controls the used driving channels $CH_{14}$, $CH_{12}$, $CH_{10}$, $CH_8$, $CH_6$, and $CH_4$ in the third subset of the driving channels of the source driver 720*b* sequentially activated by the first start pulse ASTH to receive the first pixel signal from the first data bus BUS1, and controls the used driving channels $CH_{13}$, $CH_{11}$, $CH_9$, $CH_7$, $CH_5$, and $CH_3$ in the fourth subset of the driving channels of the source driver 720*b* sequentially activated by the second start pulse to receive the second pixel signal from the second data bus according to the shift control signal CON1 and the data control signal CON2.

Referring to FIG. 7, it is noted that in the said embodiments, each source driver drives the pixel cells 711 on each scan line when the corresponding scan line is asserted, wherein the scan lines are sequentially asserted during different scan period, e.g. in order of $S_1$, $S_2$, . . . $S_T$, $S_{T+1}$, . . . , $S_P$. In another embodiment of the present invention, the source driver 720*a* and the source driver 720*b* can synchronously drive the pixel cells 711 on each scan line in the upper display panel 710 and the pixel cells 711 on each scan line in the lower display panel 710, respectively.

Figure 8:
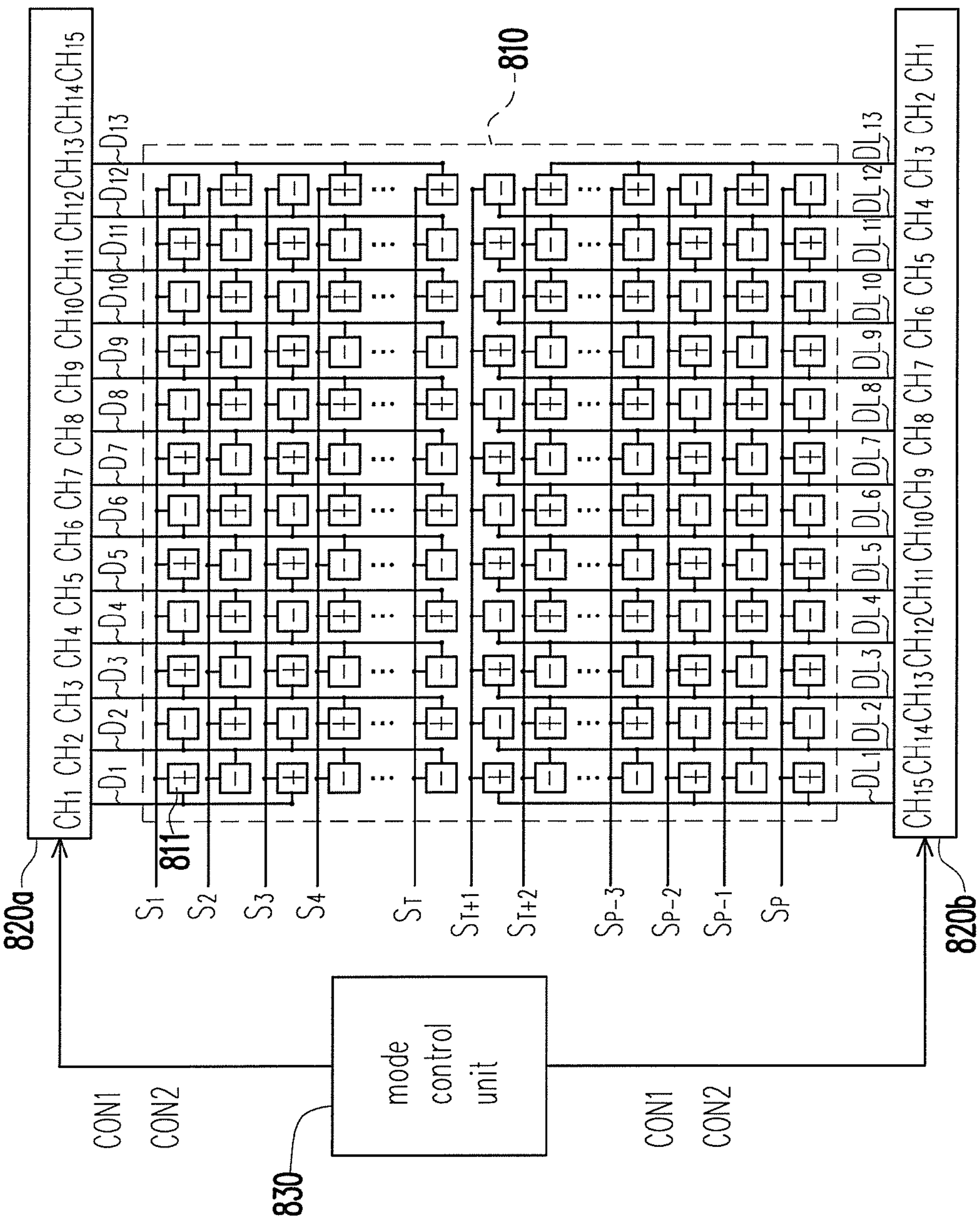

FIG. 8 is a schematic diagram of a display device according to another embodiment of the present invention. Referring to FIG. 8, for the upper display panel 810, the N pixel cells 811 on the odd-numbered scan line (e.g. $S_1$) are respectively coupled to data lines $DU_1$-$DU_N$ and the N pixel cells 811 on the even-numbered scan line (e.g. $S_2$) are respectively coupled to data lines $DU_2$-$DU_{N+1}$. For the lower display panel 810, the N pixel cells 811 on the odd-numbered scan line (e.g. $S_{T+1}$) are respectively coupled to data lines $DL_1$-$DL_N$ and the N pixel cells 811 on the even-numbered scan line (e.g. $S_{T+2}$) are respectively coupled to data lines $DL_2$-$DL_{N+1}$. When the scan lines $S_1$ and $S_{T+1}$ are synchronously asserted, the driving channels $CH_1$-$CH_N$ of the source driver 820*a* transmit the data driving signals to the pixel cells 811 on the scan line $S_1$ and the driving channels $CH_M$-$CH_{M-N+1}$ of the source driver 820*b* transmit the data driving signals to the pixel cells 811 on the scan line $S_{T+1}$. Then, when the scan lines $S_2$ and $S_{T+2}$ are synchronously asserted, the driving channels $CH_2$-$CH_{N+1}$ of the source driver 820*a* transmit the data driving signals to the pixel cells 811 on the scan line $S_2$ and the driving channels $CH_{M-1}$-$CH_{M-N}$ of the source driver 820*b* transmit the data driving signals to the pixel cells 811 on the scan line $S_{T+2}$.

Since the number of the driving channels in one source driver may not be sufficient for the display panel as the increase of display panel size. Designer must employ more source drivers for driving such display panel. The following embodiment gives the teaching of driving the display panel with high resolution by utilizing several source drivers described above for people ordinary skilled in the art.

Figure 9:
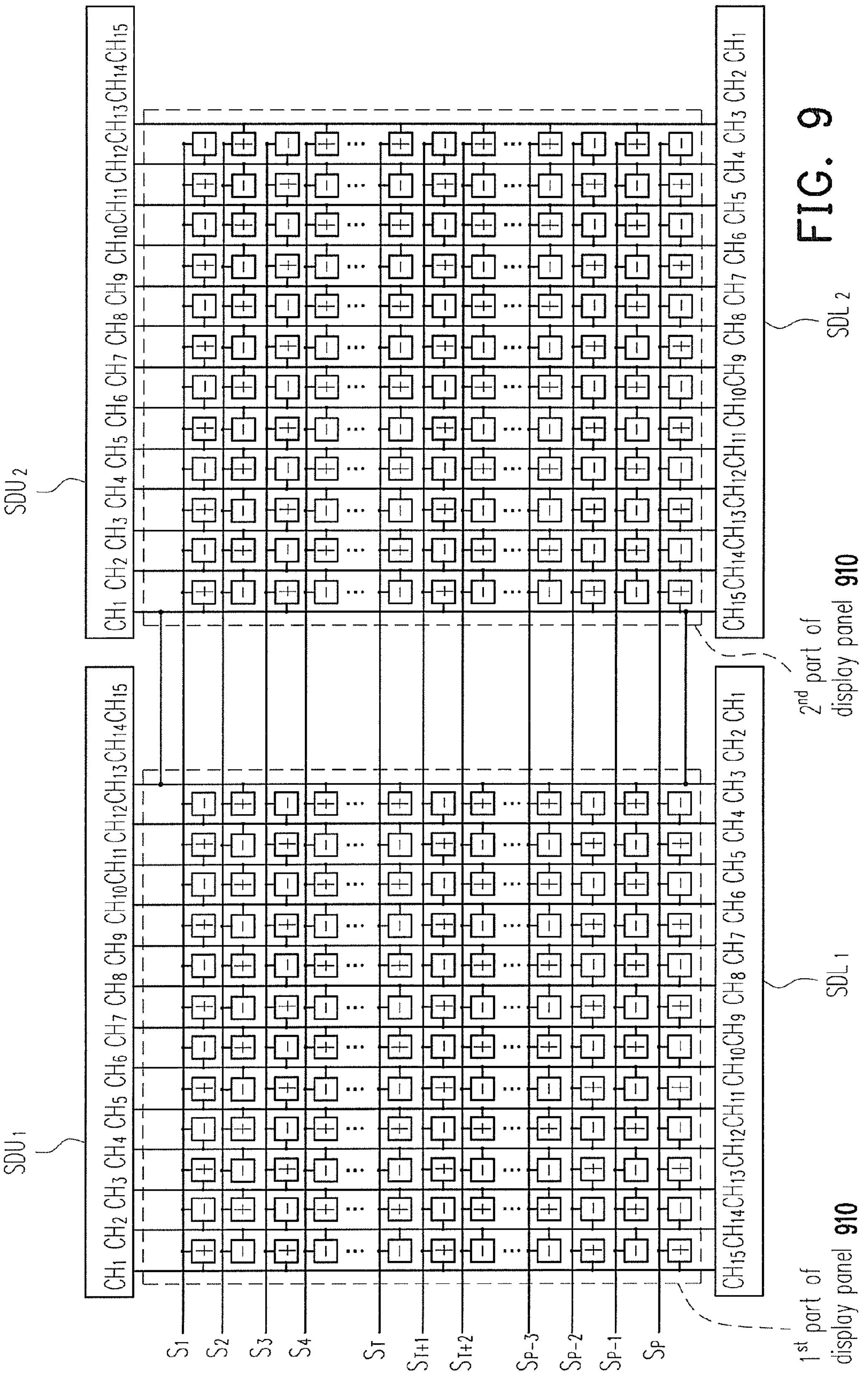

FIG. 9 is a schematic diagram of a display device according to another embodiment of the present invention. Referring to FIG. 9, the display 900 includes a display panel 910 and a driver circuit driving a plurality of pixel cells 911 arranged in an array manner on the display panel 910. Due to the increase of display panel size, the display panel 910 is separated into L parts, wherein each part of the display panel 910 includes N pixel cells 911 on each of the scan lines $S_1$-$S_P$ and L is positive integer, e.g. L=2 and N=12. The driver circuit includes the source drivers $SDU_1$ and $SDU_2$ for driving the pixel cells 911 on the upper display panel 910, and the source drivers $SDL_1$ and $SDL_2$ for driving the pixel cells 911 on the lower display panel 910. Each source driver includes M driving channels, wherein M is positive integer and M≧N, such as M=15. Each driving channel of the source driver is either set in a first mode or a second mode for receiving the signals for the corresponding data path.

When one of the scan lines (e.g. the scan line $S_1$) of the upper display panel 910 is asserted, the driving channels $CH_1$-$CH_{12}$ of the source driver $SDU_1$ respectively transmit the data driving signals to the pixel cells 911 on the scan line $S_1$ in the $1^{st}$ part of the display panel 910, and the driving channels $CH_1$-$CH_{12}$ of the source driver $SDU_2$ respectively transmit the data driving signals to the pixel cells 911 on the scan line $S_1$ in the $2^{nd}$ part of the display panel 910. When another scan line (e.g. the scan line $S_2$) of the upper display panel 910 is asserted, the driving channels $CH_2$-$CH_{13}$ of the source driver $SDU_1$ and the driving channel $CH_1$ of the source driver $SDU_2$ respectively transmit the data driving signals to the pixel cells 911 on the scan line $S_2$ in the $1^{st}$ part of the display panel 910, and the driving channels $CH_2$-$CH_{13}$ of the source drivers $SDU_2$ respectively transmit the data driving signals to the pixel cells 911 on the scan line $S_2$ in the $2^{nd}$ part of the display panel 910.

When one of the scan lines (e.g. the scan line $S_{T+1}$) of the lower display panel 910 is asserted, the driving channels $CH_{15}$-$CH_4$ of the source driver $SDL_1$ respectively transmit the data driving signals to the pixel cells 911 on the scan line $S_{T+1}$ in the $1^{st}$ part of the display panel 910, and the driving channels $CH_{15}$-$CH_4$ of the source driver $SDL_2$ respectively transmit the data driving signals to the pixel cells 911 on the scan line $S_{T+1}$ in the $2^{nd}$ part of the display panel 910. When another scan line (e.g. the scan line $S_{T+2}$) of the lower display panel 910 is asserted, the driving channels $CH_{14}$-$CH_3$ of the source driver $SDL_1$ and the driving channel $CH_{15}$ of the source driver $SDL_2$ respectively transmit the data driving signals to the pixel cells 911 on the scan line $S_{T+2}$ in the $1^{st}$ part of the display panel 910, and the driving channels $CH_{15}$-$CH_4$ of the source drivers $SDL_2$ respectively transmit the data driving signals to the pixel cells 911 on the scan line $S_{T+2}$ in the $2^{nd}$ part of the display panel 910. In order to ensure data transmission is correct, the modes of the $M^{th}$ through $1^{st}$ driving channels in each of the source drivers $SDL_1$ and $SDL_2$ are respectively set to match the modes of the $1^{st}$ through $M^{th}$ driving channels in each of the source drivers $SDU_1$ and $SDU_2$.

In summary, as to the embodiments in FIG. 4 to FIG. 9, each driving channel of the source driver in the driver circuit respectively can output data driving signals with the same polarity to pixel cells arranged in a zigzag manner interlaced on two neighboring data lines for performing dot inversion so as to save the power consumption, and increase display quality. Additionally, in the said embodiments, data modes of driving channels at two ends of the same data line in different source drivers are altered to be matched in order to ensure that the driving channels of each source driver can receive video data from the correct data path.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A driver circuit, adapted to drive a display panel comprising N pixel cells on each of a plurality of scan lines, comprising:

a plurality of source drivers, each source driver having M driving channels, wherein M≧N, and in accordance with a preset mode sequence, a first subset and a second subset of the driving channels of each source driver are respectively in a first mode and in a second mode, the source drivers at least comprising:

a first source driver, the $1^{st}$ through $N^{th}$ driving channels of the first source driver are respectively used for driving the $1^{st}$ through $N^{th}$ pixel cells during a first scan period, wherein the used driving channels in the first subset of the driving channels of the first source driver sequentially activated by a first start pulse to receive a first pixel signal from a first data bus, and the used driving channels in the second subset of the driving channels of the first source driver sequentially activated by a second start pulse to receive the second pixel signal from the second data bus; and a second source driver, the $M^{th}$ through $(M-N+1)^{th}$ driving channels of the second source driver are respectively used for driving the $1^{st}$ through $N^{th}$ pixel cells during a second scan period; and a mode control unit, controlling the used driving channels in a third subset of the driving channels of the second source driver sequentially activated by the first start pulse to receive the first pixel signal from the first data bus, and the used driving channels in a fourth subset of the driving channels of the second source driver sequentially activated by the second start pulse to receive the second pixel signal from the second data bus, so as to make the driving channels of the first source driver and the second source driver at two ends of each of a plurality of data lines to receive the pixel signals from the same data bus.

2. The driver circuit as claimed in claim 1, wherein the first source driver comprises:

a first shift register module, comprising a plurality of first shift registers, wherein the first shift registers corresponding to the used driving channels in the first subset of the driving channels of the first source driver sequentially shift the first start pulse;

a second shift register module, comprising a plurality of second shift registers, wherein the second shift registers corresponding to the used driving channels in the second subset of the driving channels of the first source driver sequentially shift the second start pulse;

a shift multiplexer module, comprising a plurality of shift multiplexers, wherein each of the shift multiplexers corresponding the N used driving channels selects one of the first start pulse shifted by the corresponding first shift register and the second start pulse shifted by the corresponding second shift register according to a shift control signal generated by the mode control unit;

a data multiplexer module, comprising a plurality of data multiplexer, wherein each of the data multiplexers corresponding to the N used driving channels selects one of the first pixel signal from the first data bus and the second pixel signal from the second data bus according to a data control signal generated by the mode control unit; and a data latch module, comprising a plurality of data latches, wherein each of the data latches is controlled by the selected start pulse from the corresponding shift multiplexer to latch the selected pixel signal from the corresponding data multiplexer.

3. The driver circuit as claimed in claim 1, wherein the second source driver comprises:

a first shift register module, comprising a plurality of first shift registers, wherein the first shift registers corresponding to the used driving channels in the third subset of the driving channels of the second source driver sequentially shift the first start pulse;

a second shift register module, comprising a plurality of second shift registers, wherein the second shift registers corresponding to the used driving channels in the fourth subset of the driving channels of the second source driver sequentially shift the second start pulse;

a shift multiplexer module, comprising a plurality of shift multiplexers, wherein each of the shift multiplexers corresponding the N used driving channels selects one of the first start pulse shifted by the corresponding first shift register and the second start pulse shifted by the corresponding second shift register according to a shift control signal generated by the mode control unit;

a data multiplexer module, comprising a plurality of data multiplexer, wherein each of the data multiplexers corresponding to the N used driving channels selects one of the first pixel signal from the first data bus and the second pixel signal from the second data bus according to a data control signal generated by the mode control unit; and a data latch module, comprising a plurality of data latches, wherein each of the data latches is controlled by the selected start pulse from the corresponding shift multiplexer to latch the selected pixel signal from the corresponding data multiplexer.

4. The driver circuit as claimed in claim 1, wherein the $2^{nd}$ through $(N+1)^{th}$ driving channels of the first source driver are respectively used for driving the $1^{st}$ through $N^{th}$ pixel cells during a third scan period, and the $(M-1)^{th}$ through $(M-N)^{th}$ driving channels of the second source driver are respectively used for driving the $1^{st}$ through $N^{th}$ pixel cells during a fourth scan period.

5. The driver circuit as claimed in claim 1, wherein the first subset of the driving channels of each source driver comprises the $(2i+1)^{th}$ driving channel of each source driver, and the second subset of the driving channels of each source driver comprises the $(2i+2)^{th}$ driving channel of each source driver according to the preset mode sequence, and i is non-negative integer.

6. The driver circuit as claimed in claim 5, wherein the third subset of the driving channels of the second source driver comprises the $(2i+2)^{th}$ driving channel of the second source driver, and the fourth subset of the driving channels of the second source driver comprises the $(2i+1)^{th}$ driving channel of the second source driver when the number of the driving channel of each source driver is equal to 2k+2, and k is non-negative integer.

7. The driver circuit as claimed in claim 6, wherein the N pixel cells on one of the scan lines are respectively coupled to the $1^{st}$ data line to the $N^{th}$ data line, and the N pixel cells on the scan line neighboring to the one of the scan lines are respectively coupled to the $2^{nd}$ data line to the $(N+1)^{th}$ data line.

8. The driver circuit as claimed in claim 1, wherein the first subset of the driving channels of each source driver comprises the $(4i+1)^{th}$ driving channel and the $(4i+2)^{th}$ driving channel of each source driver, and the second subset of the driving channels of each source driver comprises the $(4i+3)^{th}$ driving channel and the $(4i+4)^{th}$ driving channel of each source driver according to the preset mode sequence, and i is non-negative integer.

9. The driver circuit as claimed in claim 8, wherein the third subset of the driving channels of the second source driver comprises the $(4i+1)^{th}$ driving channel and the $(4i+4)^{th}$ driving channel of the second source driver, and the fourth subset of the driving channels of the second source driver comprises the $(4i+2)^{th}$ driving channel and the $(4i+3)^{th}$ driving channel when the number of the driving channel of each source driver is equal to 4k+1, and k is non-negative integer.

10. The driver circuit as claimed in claim 8, wherein the third subset of the driving channels of the second source driver comprises the $(4i+2)^{th}$ driving channel and the $(4i+3)^{th}$ driving channel of the second source driver, and the fourth subset of the driving channels of the second source driver comprises the $(4i+1)^{th}$ driving channel and the $(4i+4)^{th}$ driving channel of the second source driver when the number of the driving channel of each source driver is equal to 4k+3, and k is non-negative integer.

11. The driver circuit as claimed in claim 8, wherein the third subset of the driving channels of the second source driver comprises the $(4i+3)^{th}$ driving channel and the $(4i+4)^{th}$ driving channel of the second source driver, and the fourth subset of the driving channels of the second source driver comprises the $(4i+1)^{th}$ driving channel and the $(4i+2)^{th}$ driving channel of the second source driver when the number of the driving channel of each source driver is equal to 4k+4, and k is non-negative integer.

* * * * *